(12) United States Patent
Dove et al.

(10) Patent No.: US 9,118,403 B2
(45) Date of Patent: Aug. 25, 2015

(54) THERMALLY COMPENSATED CATV GAIN CONTROL APPARATUS AND FIRMWARE

(71) Applicant: ACI Communications, Inc., Kent, WA (US)

(72) Inventors: Donald Charles Dove, Kent, WA (US); Wen-Chieh Tsai, New Taipei (TW)

(73) Assignee: ACI COMMUNICATIONS, INC., Kent, WA (US)

( * ) Notice: Subject to any disclaimer, the term of this patent is extended or adjusted under 35 U.S.C. 154(b) by 11 days.

(21) Appl. No.: 13/677,188

(22) Filed: Nov. 14, 2012

(65) Prior Publication Data

US 2013/0122839 A1    May 16, 2013

Related U.S. Application Data

(60) Provisional application No. 61/559,701, filed on Nov. 14, 2011.

(51) Int. Cl.
| | |
|---|---|
| *H04B 17/02* | (2006.01) |
| *H04B 1/06* | (2006.01) |
| *H04B 7/00* | (2006.01) |
| *H04B 1/76* | (2006.01) |
| *H03G 3/00* | (2006.01) |
| *H03G 3/30* | (2006.01) |

(52) U.S. Cl.
CPC ............... *H04B 1/76* (2013.01); *H03G 3/001* (2013.01); *H03G 3/3073* (2013.01); *H03G 3/3089* (2013.01)

(58) Field of Classification Search
CPC ........ H03G 3/001; H03G 3/3068; H03G 3/24

USPC ........ 455/134, 136, 138, 232.1–234.2, 240.1, 455/249.1–252.1
See application file for complete search history.

(56) References Cited

U.S. PATENT DOCUMENTS

| | | | |
|---|---|---|---|
| 6,545,728 B1* | 4/2003 | Patel et al. .................... | 348/725 |
| 6,625,433 B1* | 9/2003 | Poirier et al. ............... | 455/232.1 |
| 8,223,900 B2* | 7/2012 | Zocher et al. ................. | 375/345 |
| 8,428,535 B1* | 4/2013 | Cousinard et al. .......... | 455/234.2 |
| 2002/0042256 A1* | 4/2002 | Baldwin et al. ............. | 455/232.1 |
| 2002/0061763 A1* | 5/2002 | Weissman ..................... | 455/522 |
| 2003/0091132 A1* | 5/2003 | Anderson ..................... | 375/345 |
| 2004/0043729 A1* | 3/2004 | Kasperkovitz ................ | 455/130 |
| 2004/0092238 A1* | 5/2004 | Filipovic ........................ | 455/131 |
| 2004/0264608 A1* | 12/2004 | Habuka et al. ................ | 375/345 |
| 2006/0135104 A1* | 6/2006 | Lee et al. .................... | 455/234.1 |
| 2007/0243841 A1* | 10/2007 | Husted et al. ............... | 455/226.3 |
| 2007/0275680 A1* | 11/2007 | Kaiki et al. ................ | 455/184.1 |
| 2009/0046809 A1* | 2/2009 | Meltzer ......................... | 375/308 |
| 2010/0322360 A1* | 12/2010 | Braicu et al. .................. | 375/345 |

(Continued)

*Primary Examiner* — Simon Nguyen
(74) *Attorney, Agent, or Firm* — Lowe Graham Jones PLLC

(57) ABSTRACT

A compact automatic gain control module for an RF amplifier includes a microchip Tuner for detection of pilot signals in an incoming RF signal. By selectively tuning into pilot signals in response to command from an on-board microprocessor, the module is frequency agile in the selection of pilot signals, selecting specifically advantageous signals for use as a pilot. Use of a microprocessor also enables specific advantages in receiving firmware upgrades to incorporate algorithms for operation parameter monitoring and adjustment of response in accord with monitored parameters. Such monitoring also enables the recording of on-module events that enable storage of a log to enable maintenance and performance enhancement within the module.

7 Claims, 7 Drawing Sheets

(56) References Cited

U.S. PATENT DOCUMENTS

| | | | |
|---|---|---|---|
| 2011/0067083 A1* | 3/2011 | Vorenkamp et al. | 725/131 |
| 2012/0149322 A1* | 6/2012 | Kuo et al. | 455/234.1 |
| 2012/0297263 A1* | 11/2012 | Taya | 714/733 |
| 2014/0133606 A1* | 5/2014 | Mochizuki | 375/340 |

* cited by examiner (Prior Art)

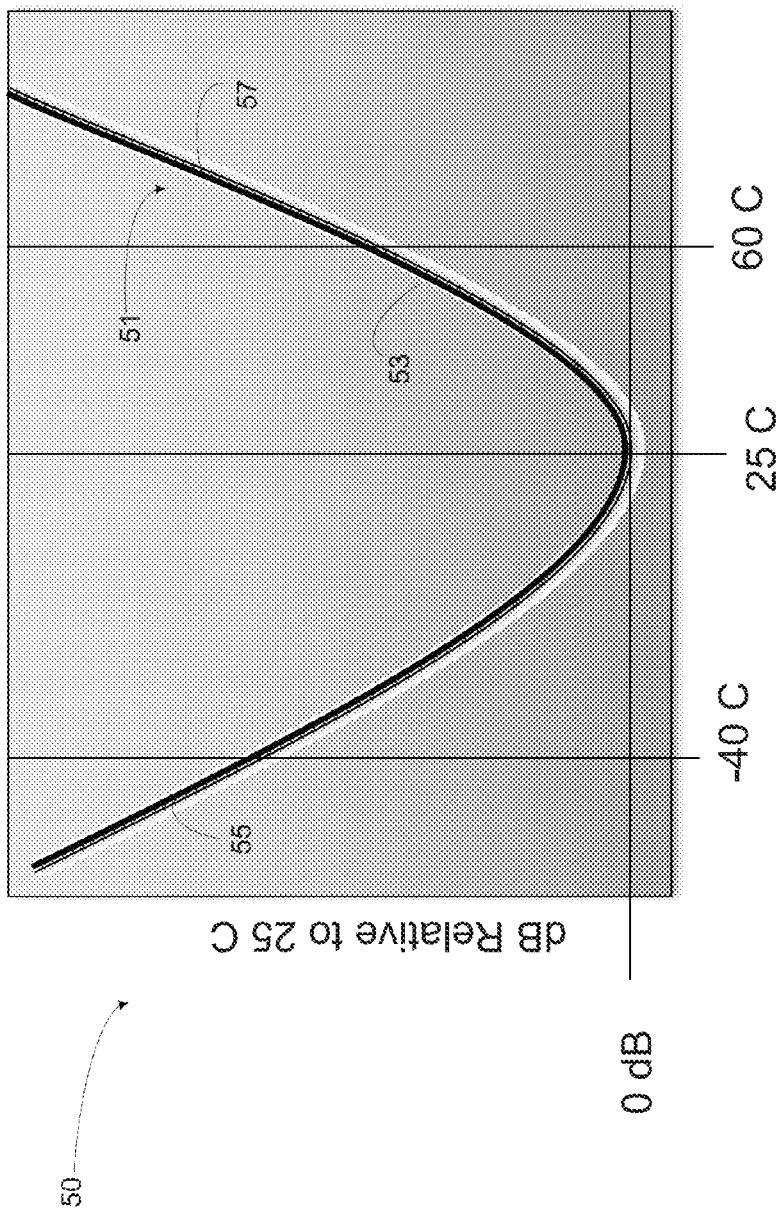

THERMALLY COMPENSATED CATV GAIN CONTROL APPARATUS AND FIRMWARE

PRIORITY CLAIM

This application claims priority to the Provisional Application on file under Ser. No. 61/559,701 filed on Nov. 14, 2011.

FIELD OF THE INVENTION

An automatic gain control exploiting a tuner stage, more specifically a compact automatic gain control module is presented.

BACKGROUND OF THE INVENTION

Communication systems, such as two-way cable television systems, typically process signals in both the forward, or downstream, direction and the reverse, or upstream, direction. These signals may travel long distances and, as a result, distribution amplifiers are typically employed to amplify the signal levels of the forward and reverse signals. The lines that carry the signals have losses that vary with temperature. In addition to the lines, the performance of amplifiers within a communication system varies with the temperature. A cable distribution system is especially sensitive to temperature changes since the amplifiers and the coaxial cable are at ambient temperature, which can fluctuate greatly during a day or seasonally. Some communication systems consequently have to be operable over a range of temperatures from −40.degree. C. to +60.degree. C. As a result, the signal output varies with temperature and, as a result, fluctuations in attenuation across the system can introduce distortion into the signal.

To minimize the fluctuations based upon temperature, conventional amplifiers have used thermal circuits to detect the temperature within the amplifier. As the temperature within the amplifier rises, a variable attenuator, such as a Bode circuit, is adjusted to boost the gain of the amplifier. So configured, the circuit compensates for the decrease in gain that is a normal consequence of higher temperatures. Thermal circuits, however, are relatively imprecise and may not be able to compensate for other causes of gain variation. An example of such an arrangement can be found in U.S. Pat. No. 4,812,779, to Wagner.

A similar configuration of a representative block diagram of a thermally controlled amplifier 6 is depicted in FIG. 1. Because to include them will not enrich the discussion, the details of the Level Sensing Circuit 6 are not shown. While relatively effective, the thermal circuit was not based solely upon detected levels in the signal but rather relies, as well, on thermal condition of the amplifier itself and the known response to it. Important building blocks are present as well. First, there is a signal conditioner and comparator 11 that compares the strength of a gain request voltage that the Level Sensing Circuit 6 produces as indicia of signal strength. The comparator 11 compares the from a known signal source 7 (in this case a manual designate reference signal), and as a result formulates a "gain up" or "gain down" signal it passes to the Equalizer Driver 13, which in turn directs the Equalizer 17 to amplify or attenuate the input to produce an output signal that is relatively stable even in light thermal fluctuations.

Additional accuracy in signal processing can be achieved through automatic amplification and attenuation that monitors a signal level of a distinct pilot signal and then attenuates or amplifies the received RF signal in accord with the amplitude of the received pilot signal so the received RF signal maintains a constant and optimum level so the signal suffers minimal distortion as it is processed by the receiver. Automatic gain control (AGC) is an adaptive system found in many electronic devices including amplifiers.

While either a digital or an analog pilot signal will work for purpose of most AGC circuits, generally, customers such as providers of cable television do not wish to be tied to an analog pilot signal. Referring, for example, to the actual waveforms as shown in FIG. 2. NTSC 26, or analog television signals occupy a very narrow portion 27 of an allocated channel in the spectrum. On the other hand, a QAM channel 29 occupies a wider portion 28 of the allocated channel.

Maintaining an analog carrier for the purpose of enabling AGC is inefficient, as the same 6 MHz occupied spectrum could carry several digital services. To that end, it is extremely desirable to develop an AGC circuit based upon a digital signal known as a quadrature amplitude modulated (QAM) pilot signal.

Because of the need for AGC circuitry in system amplifiers, such as those used in the distribution of cable television through coaxial networks, the electronics industry has adopted a standard form factor to a package known as a Compact AGC module for insertion into amplifiers and thereby to enable AGC functionality in such amplifiers. In the present form factor, these AGC modules plug into sockets configured to receive the form factor into physical and electronic incorporation into the amplifiers.

Conventionally, two sorts of AGC circuits are available in a compact AGC module. First, a single pilot level sensing is used on a single channel and is conditioned by a narrow-pass ring. The advantage of a single pilot level is that its gain control is the more accurate of the two types. Generally, they used a fixed channel and often NTSC channels. Single pilot level sensing is recommended for trunk or buried plants. The single pilot AGC circuit is recommended for medium to long cascades. A representative example of the Single Pilot Compact AGC Module 8 is depicted in FIG. 3. Shown here, in addition to the components shown in the thermal sensing circuit unit is a Narrow Band Filter 10. An ideal Narrow Band Filter 10 would have a completely flat narrow band (e.g. with no gain/attenuation throughout) and would completely attenuate all frequencies outside the designated narrow band. Additionally, the transition out of the narrow band would be instantaneous in frequency giving steep and immediate attenuation outside of the designated narrow band.

In practice, no Narrow Band Filter 10 is ideal. The filter 10 does not attenuate all frequencies outside the desired frequency range completely; in particular, there is a region just outside the intended Narrow Band where frequencies are attenuated, but not rejected. Nonetheless, filtering an incoming signal with a Narrow Band Filter yields a signal generally proportionate to the signal strength within the narrow band. Where the narrow band is selected to be a pilot signal, the gain request voltage provided to the Comparator 11 reflects the power received in the pilot band frequency. All other components function just as they do in the Thermally Controlled Circuit 6 shown in FIG. 1.

A second type is known as composite pilot level AGC. Using a whole composite carrier as a pilot rather than a single channel. Composite AGC employs a wideband filter primarily for economic purposes. A wideband filter is easier to make and cheaper to build. Using a composite gives a larger part of the spectrum and, thus, detected power is about 5 times, or about 7 dB, greater than a single pilot AGC. Loss of even one of the pilot channels means a concurrent loss of 1 dB of error in gain control due to that loss of signal strength. Composite pilot sensing allows the AGC function at lower cost than single pilot sensing types. The composite AGC also performs its signal attenuation and gain with lower accuracy than single pilot sensing types and to perform optimally, the composite AGC requires careful balancing of 5 pilot channels for proper operation. The composite AGC is useful for trunk or buried plant and can be used in a cascade configuration. The composite pilot AGC is portrayed in FIG. 4.

In comparing FIGS. 3 and 4, it is notable that both types of AGC exploit the same equalizer circuit (and loss) as single pilot comprising a Comparator 11, an Equalizer Driver 13 and an Equalizer 15. Because the signal strength in a received signal, once sensed, either by single or composite pilot means that a voltage resulting from a received signal is presented to a Comparator 11 against a manually designated level in accord with a reference voltage generated at the Manual Level Set 7. Where the sensed signal strength voltage exceeds the manual level, Equalizer Driver 13 drives the Equalizer 15 to attenuate the incoming signal. Similarly, where the sensed strength of the signal results in a smaller voltage at the comparator, the Equalizer Driver 13 instructs the Equalizer 15 to amplify the signal. The process of always comparing an output to a reference signal is known as a closed loop feedback control and in this case is based upon a received voltage representing the signal strength of the pilot signal at a receiver.

What is absent in the art is an automatic gain control circuit that can detect a narrow band that is designatable or frequency nimble in order to detect a signal in a received spectrum without the use of an expensive Narrow Band Filter 10.

BRIEF DESCRIPTION OF THE DRAWINGS

Preferred and alternative examples of the present invention are described in detail below with reference to the following drawings:

FIG. 7 is a graphic representation of an observed relationship between output signal strength in a microchip tuner and temperature of that tuner.

DETAILED DESCRIPTION OF THE PREFERRED EMBODIMENT

In electronics, a heterodyne tuner uses frequency mixing or heterodyning to convert a received signal to a fixed intermediate frequency (IF), which can be more conveniently processed than the original radio carrier frequency. Virtually all modern radio and television receivers use the heterodyne principle. To heterodyne means to mix to frequencies together so as to produce a beat frequency, namely the difference between the two. A local oscillator is linked to the tuner because they both must vary with the carrier frequency in order to produce an IF at a fixed frequency. By selecting the oscillator frequency appropriately, a part of the spectrum can be selected such that it falls within an exact frequency specification. The side-bands occur at precisely the sum and difference frequencies of the carrier and information. These are beat frequencies (normally the IF is associated with the lower side-band, the difference between the two).

All of the information and signal strength is contained in the IF and the IF is far easier to process. There are three main advantages to dealing with the IF: 1) the IF is readily used by conventional components where, in using RF, conventional components wouldn't be able to resolve signals at such high frequencies; 2) the IF is a fixed frequency and can be easily isolated in a more complex spectrum; and 3) at an IF arithmetic selectivity improves the ability to isolate a pilot signal in a received RF signal.

A key insight in the instant application is that rather than to filter a received RF signal with expensive narrow band path filters, an IF signal would carry with it all of the appropriate signal strength information and could far more readily be used to isolated a signal on a pilot frequency. As importantly, an IF signal is available from a new generation of single chip tuners that have dropped in price as large scale integration has made such components available in single silicon chip packages.

One such single silicon chip package is manufactured by CSR RC, located in Churchill House, Cambridge Business Park, Cambridge England. CSR RC offers a tuner known as the MicroTuner™ MT2063, which is an advanced, low-power single-chip tuner, optimized for terrestrial and cable television reception. The MT2063 exploits a dual-conversion architecture having an integrated preselection filter at the RF input. It provides excellent in-band flatness as well as consistent gain characteristics across the complete reception band.

Figure 1:
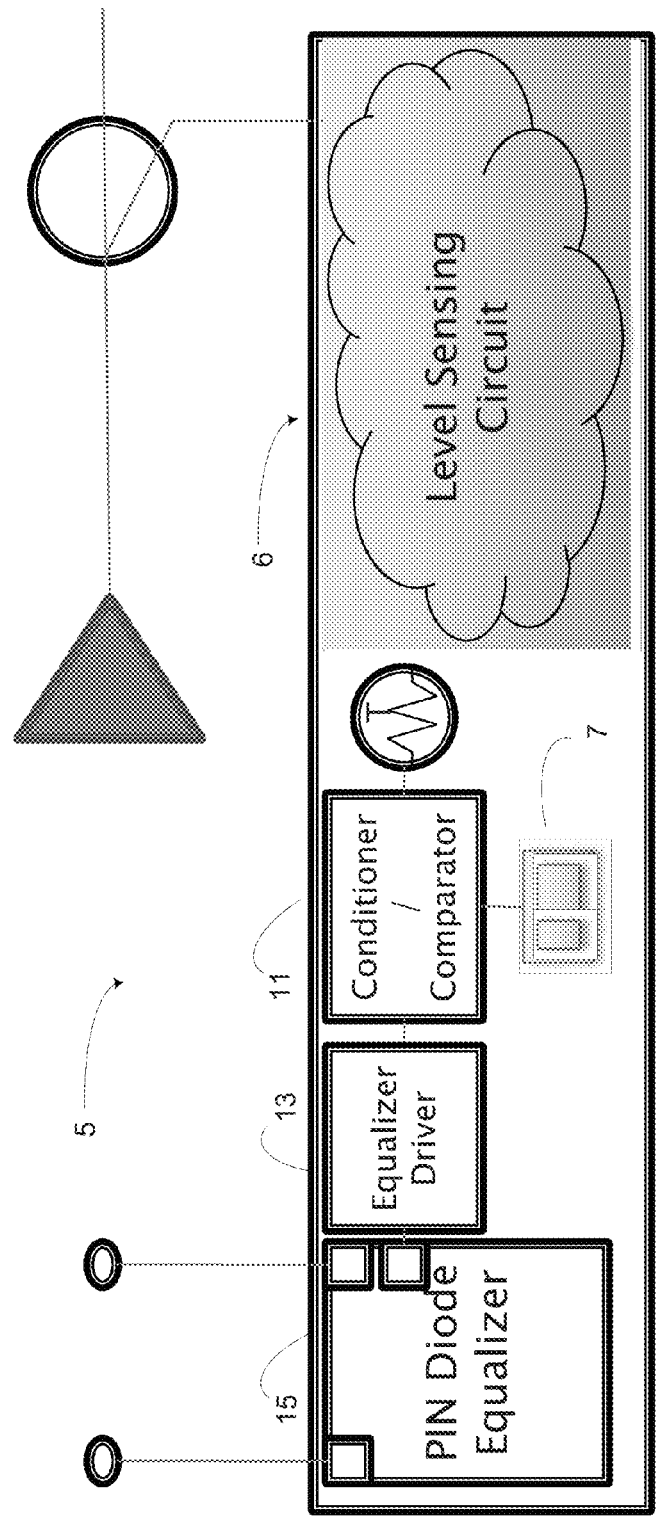
FIG. 1 depicts, in block diagram, a prior art thermally sensitive gain control module.
Figure 2:
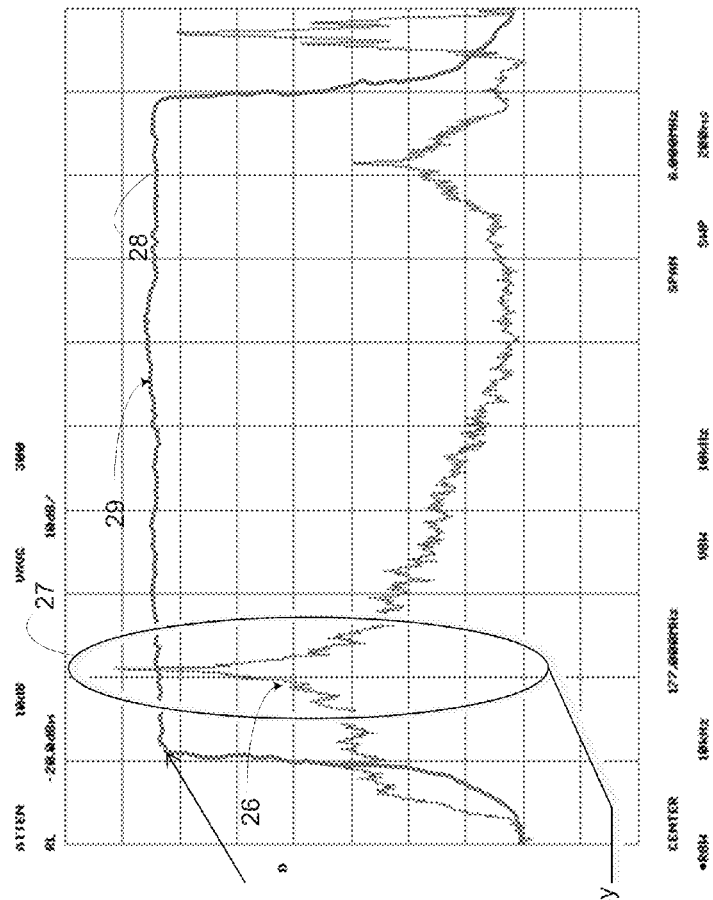
FIG. 2 is a graphic representation of alternate modulation schemes within an assigned channel frequency RF spectrum.
Figure 3:
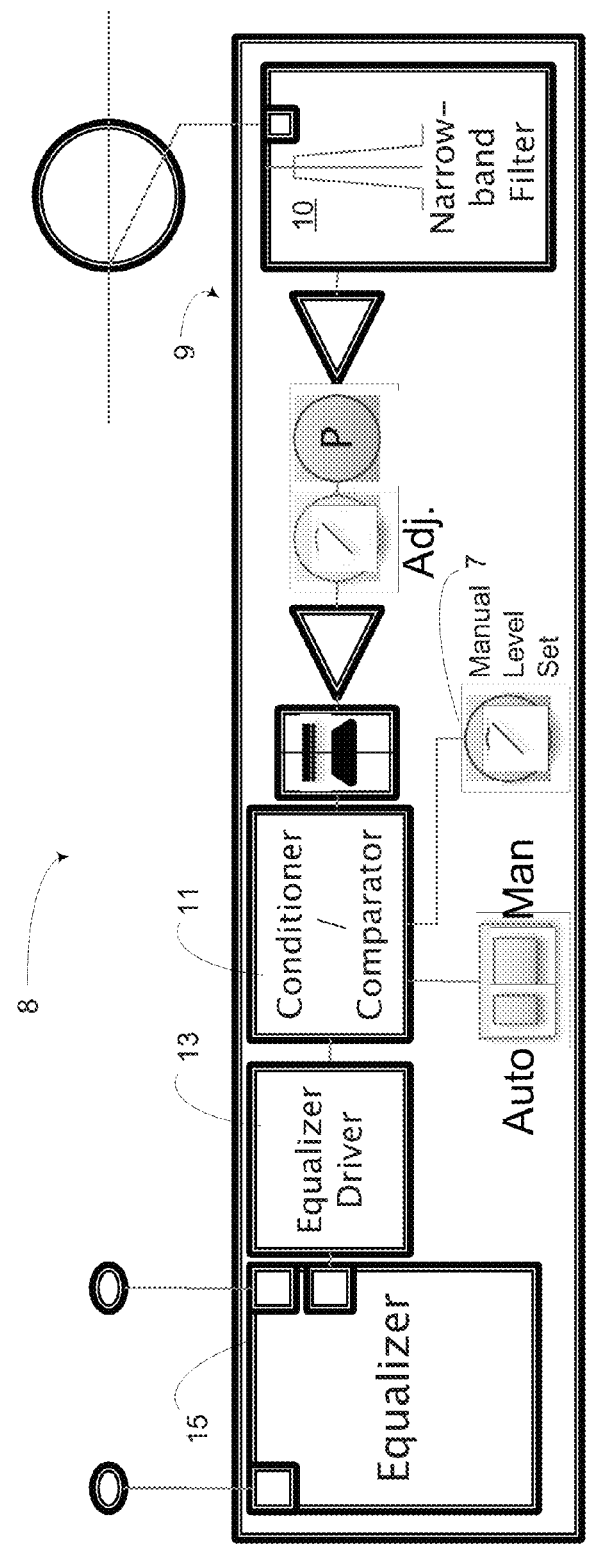
FIG. 3 depicts, in block diagram, a prior art single pilot compact automatic gain control module.
Figure 4:
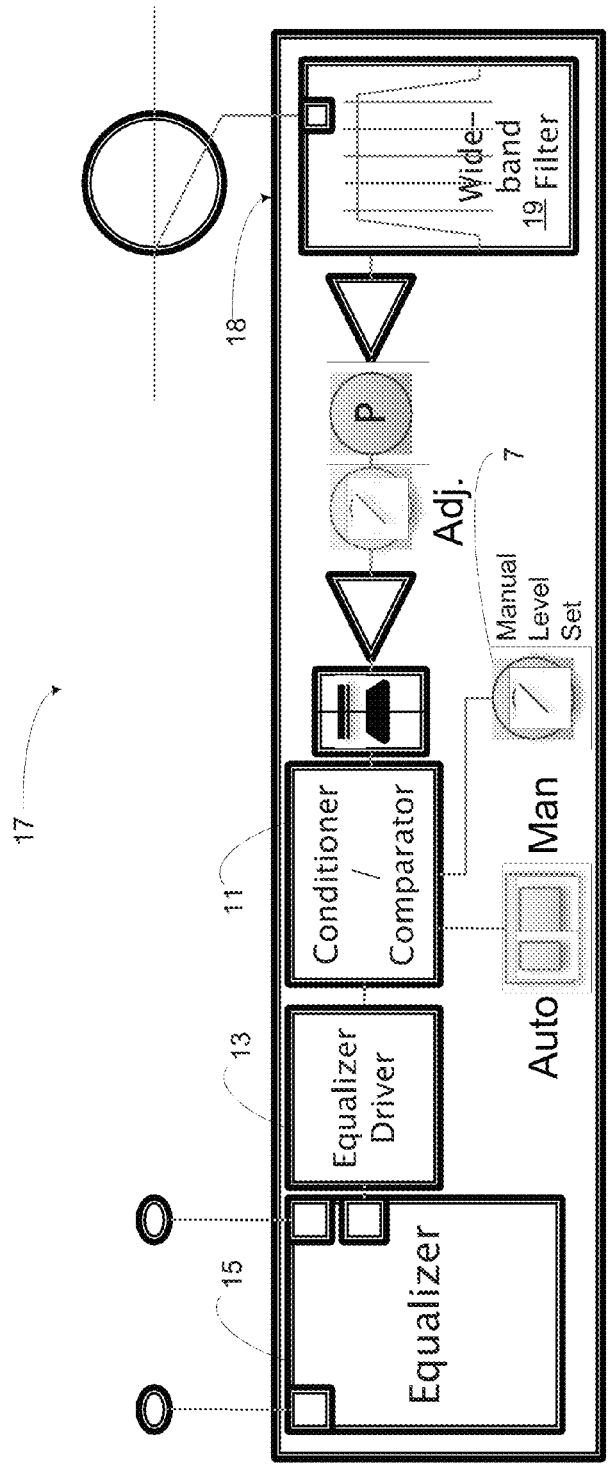
FIG. 4 depicts, in block diagram, a prior art composite pilot compact automatic gain control module.
Figure 5:
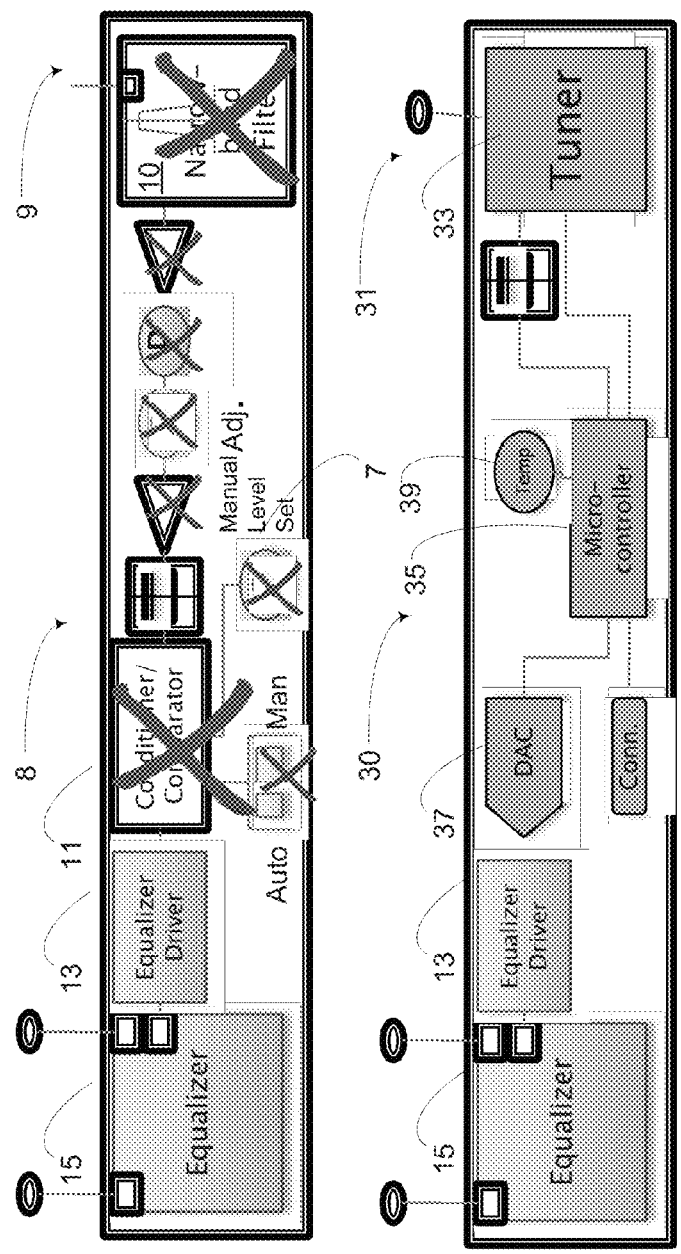
FIG. 5 depicts, in block diagrams, a comparison of the prior art single pilot compact automatic gain control module and an inventive single pilot compact AGC module having a tuner stage.

Referring to FIG. 5, the single pilot compact AGC module 5 is compared to the inventive gain control device to be marketed under the name Digital Station Intelligence Manager or DSIM 30. Just as with the single pilot AGC module 5, the DSIM includes an Equalizer Driver 13 and an Equalizer 15 which function based upon a gain request voltage presented at the Equalizer Driver 13.

In the inventive DSIM 30, a new signal processing stage 31 receives the RF signal at an digital tuner 33 such as the MicroTuner™ MT2063. The DSIM 30 does not specifically require the MicroTuner™ MT2063 as opposed to other such Microchip Tuners 33 such that this disclosure is not limited only to the MT2063 but will work with any Microchip Tuner 33 that will produce an IF and has a local oscillator that will respond suitably to commands generated by a Microcontroller 35 to produce a beating signal of a specific and precise frequency and amplitude.

Also present in the DSIM 30 is a Digital to Analog Converter 37 which receives a gain request as a digital signal from the Microcontroller 35, i.e. a specific number or gain request coefficient, and converts that numeric gain request coefficient into a gain request voltage presented at the Equalizer Driver 13 just as the Conditioner/Comparator 11 presented a gain request voltage in the single pilot compact AGC module 5.

In the DSIM 30 the Microcontroller 35 generates commands that set the Tuner 33 to be receptive to a designate channel and, importantly, to a specific modulation mode. As discussed above, pilot signals can be either digital (QAM) or analog (NTSC) and in that context, the distinctions between the two modulation modes are such that the Tuner 33 can be designated to be sensitive "on the fly" rather than to be constructed in a Narrow Band Filter 10 specifically "hardwired"

to a single frequency and mode of modulation. The resulting IF signal is, thus, laden with all information necessary to assess signal strength.

Even in its most versatile form, a tunable single pilot compact AGC module 5 can only select a channel based upon a physical Narrow Band Filter 10 for each channel. In the most sophisticated offering, the Narrow Band Filter 10 would be a SAW filter for each channel. SAW (surface acoustic wave) filters are electromechanical devices commonly used in radio frequency applications. Electrical signals are converted to a mechanical wave in a device constructed of a piezoelectric crystal or ceramic; this wave is delayed as it propagates across the device, before being converted back to an electrical signal by further electrodes. The delayed outputs are recombined to produce a direct analog implementation of a finite impulse response filter. Such filtration is expensive and thus cost escalates with each of the several channels the tunable single pilot compact AGC module 5 comprises. DSIM 30 with its tunable Microchip Tuner 33 eliminates the need for a different SAW filter for each channel.

Figure 6:
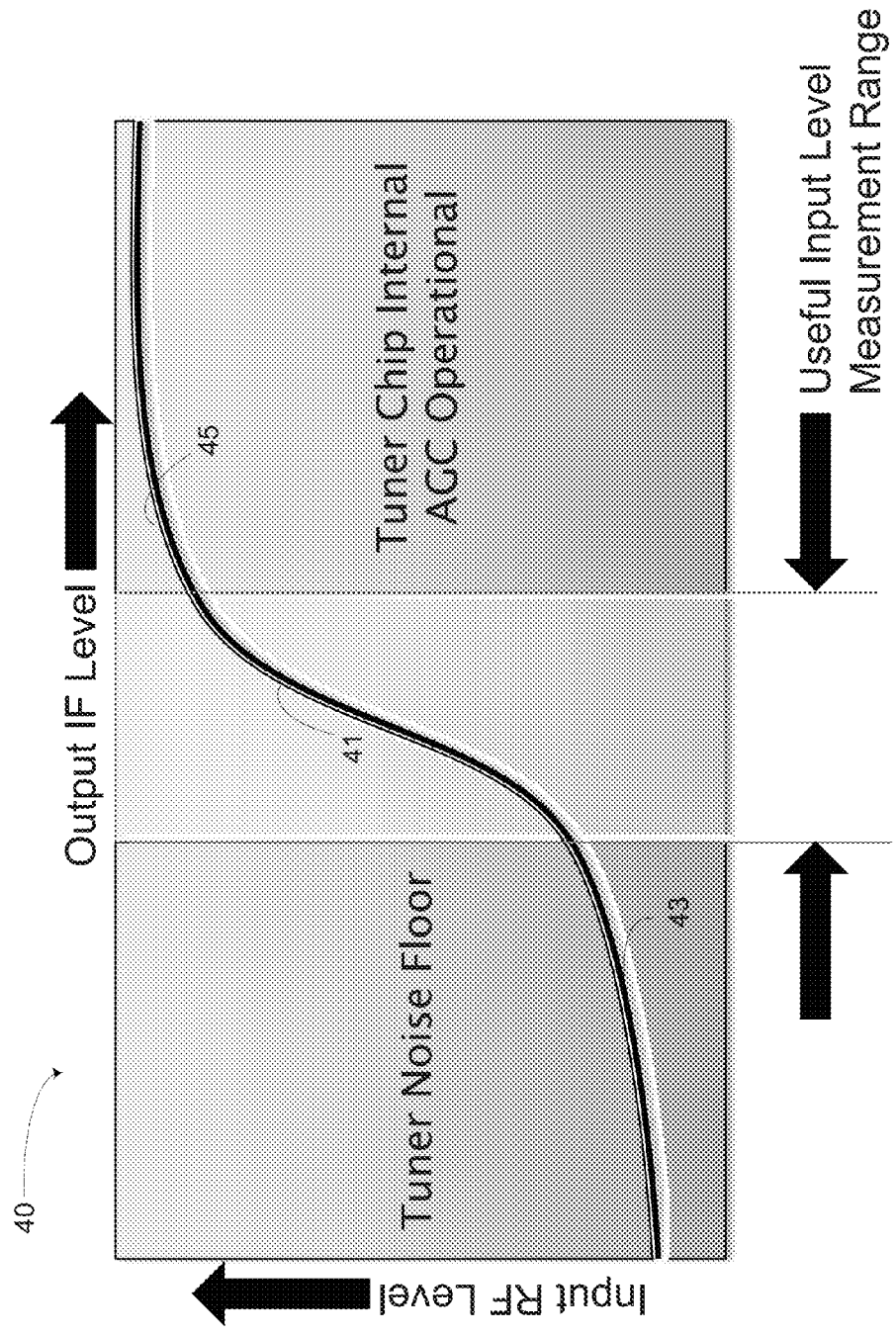
FIG. 6 is a graphic representation of an observed relationship between a signal strength of an RF signal input and an IF signal output from a microchip tuner.

Referring to FIG. 6, in operation, the Tuner 33 (FIG. 5) can be most advantageously exploited where an inbound RF signal is received at the Tuner 33 just below its operating range 15, i.e. that range where the detector on the Tuner 33 would be readily relied upon to draw an information signal out of the received RF signal. In the operating range 15, Microchip Tuners 33 generally each possess an onboard AGC circuit that limits the magnitude of a generated IF signal. For that reason, the RF input in the operating range 45 is not useful for AGC processing by the Microprocessor 35 (FIG. 5). Similarly, the input RF signal in an area beneath the Tuner 33 noise floor 43 is also flat and not useful for discerning signal strength in an output IF. There exists, then, a Useful Input Level Measurement Range 41 wherein the Tuner 33 is specifically useful in sensing an input RF level and providing a signal the Microprocessor 35 can use for discernment of a pilot signal strength. Architectural choices in the RF stage will assure that the levels sensed at the Tuner 33 input will be within the Useful Input Level Measurement Range 41.

Importantly, key features of the DSIM 30 can be programmed into firmware rather than to be inherent in hardware architecture. An example of such programmable features exists in the ability for the DSIM 30 to be frequency nimble without the presence of distinct SAW filters. By way of non-limiting example, the Microcontroller 35 monitors the signal strength in an output at a detector on the Tuner 35 to determine signal strength at a designate frequency. Where a signal strength at a designated pilot frequency falls below a designatable threshold, the Microcontroller 35 can command the Tuner 33 to seek a new pilot in accord with specifications stored in the Microcontroller 35 as a look-up table or, alternatively, in algorithmic routines that hunt out a new usable pilot signal.

Importantly, as well, the Microcontroller 35 can further monitor other variables that affect signal strength as the Tuner 33 perceives it. As mentioned above in the Background, temperature can be monitored at a Temperature Sensor 39. The DSIM 30 can actively monitor temperature and can control the response and thresholds for response to switch to thermal correction if pilot is lost. In prior generation level sensing gain controls, for example an advanced single pilot compact AGC module 5, loss of pilot meant Equalizer 15 maxes out because the gain request voltage is so high because the received pilot signal strength is so low. The Equalizer 15 is driven into clipping, causing high distortion at end of line. In the DSIM 30, when a detected signal in the IF section does not exceed a given threshold, the Microcontroller 35 commands the Tuner 33 to seek out a new pilot without driving the Equalizer 15 to distortion.

Referring to FIG. 7, a Tuner 33 will have a Characteristic Response 50 showing Tuner 33 designated as "Input Level Over Temperature" Response Curve 51, that can be learned through testing. Advantageously, in most instances, the Response Curve 51 will be largely in the form of a modulus function or "absolute value function" being a generally smooth curve having a specific corner at a point where operation is optimal. Lacking points of discontinuity, the Curve 51 is predictable within the operating temperature range 53 and like the response to a lost pilot signal can be programmed into the Microprocessor 35 in much the same manner either through a look-up table or an algorithmic diminution of the gain request coefficient consistent with known values for the Curve 51 within the Operating Range 53. Values either below the operating temperature range 55, or above the operating range 57 are simply ignored as not useful.

Similarly, a microprocessor can, at a voltage divider constantly monitor the amplifier's 24 VDC line power in order to detect variations such as ripple currents through that value and adjust the gain voltage request coefficient to account for the Tuner's 33 known response to such supply power variation in very much the same method as is used for the temperature compensation discussed above.

Referring again to FIG. 5 additional capability is also available in the exploitation of a Microcontroller 35 in the monitoring of an output from the Tuner 33. The Microcontroller 35 can be further programmed to monitor abnormal events within the DSIM 30 and to record those events in a log to provide diagnostic data to the maintenance team for preventive maintenance. No such capability exists in the Single Pilot Compact AGC Module 8.

The Microprocessor 35 is not necessarily limited to recording data only where an event such as an "out of range" variable is sensed at the Microprocessor 35. In the presently preferred embodiment, the Microprocessor 35 collects data at settable intervals for all monitored parameters. In such a manner, where a previously unstudied parameter is discerned as affecting the Tuner 33 response, firmware algorithms can be devised and can be uploaded to update the specific performance of the Microprocessor 35 in instances where the previously unstudied parameter proves relevant. Thus, by iterative study and programming, the DSIM 30 can become more and more accurate as it determines and sends error and correction signal to the DAC 37 which, in turn, drives the AGC module's Equalizer 15.

Surprisingly, in the development of the DSIM 30, the module has proved to be competitive with the Single Pilot Compact AGC Module 8. With all the added capability, it would seem that the DSIM 30 should cost quite a bit more than its predecessors. However, the DSIM 30 design process merely traded quite a few low functioning but expensive parts, such as gain blocks, RF potentiometers, switches, adjustable pads, and custom SAW filters, for a few high functioning parts such as the Tuner 33 and Microprocessor 35 to yield a compact module of comparable cost.

Yet by using some known components such as the Equalizer Driver 13 and the Equalizer 15, the DSIM 30 exploits known reliabilities while providing a different in level sensing and pre-drive circuitry. The DSIM 30 is built around the identical equalizer and equalizer driver as previous Augat generations, so the DSIM 30 maintains the identical loss profile that has proven to be very favorable in the previous generations of compact AGC modules.

As mentioned above, the control loop is Microprocessor 35 based and as such allows constant refining of control loop routines over previous generations, as well as the ability to enhance control loop routines through firmware upgrades. While above, the discussion has been limited to off-module study of recorded results, there is nothing that inherently limits refinement of the control loop to such off-module improvements.

The DSIM 30 uses an inherently different method of channel discrimination and by exploiting its agile frequency discrimination rather than relying upon fixed pilot discrimination, the DSIM 30 may be programmed to have the ability to improve without off-module intervention. Because the DSIM 30 can be programmed not only to allow better selection of the pilot, but also to give the DSIM 30 the capability to monitor and record levels at channels other than its own pilot. As configured, the Microcontroller can record and observe variations in other candidates for a selected pilot signal. With preprogrammed criteria for selection, this capability provides for enhanced broadband profile analysis, almost as might be available with an on-board field strength meter. Because an AGC performs its function over long periods of time relative to the frequency of the received RF signal repeated iterations would allow for improvement of response over time in an organized algorithmic study of incoming signals in a manner that cannot, by way of contrast, be determined from a single visit to a single station. The Microprocessor 35 can be programmed to repeatedly analyze the DSIM 30 to determine suitable responses to the following questions:

Is it tracking the pilot?
Is it performing over the specified range?
Is the set point correct?
Have there been input level events (loss of pilot, ingress over pilot)
Has operating temperature remained within the specified range?
Is performance degrading?
Is the AGC "maxing out" in hot or cold extremes?

The DSIM monitors pilot level, equalizer set level, temperature, 24 VDC, and 24 VDC ripple level.

Up to 30 days of data can be stored and downloaded for analysis. Intervals are user selectable. This allows a technician to isolate intermittent level issues to their root causes in a timely manner.

Alarm events are also monitored and stored.
Alarm thresholds can be set by user.

Finally, by relying upon the Microprocessor 33 rather than designed characteristics of a Narrow Band Filter 10 for frequency discrimination, the Microprocessor can be programmed to also perform recurrent tasks such as those in calibration of the DSIM 30. Consider, by way of nonlimiting example, the addition of a subroutine to align the DSIM 30 with specific pilot signals as may be available in a received RF signal. In an exemplary subroutine named ALIGN, a procedure that characterizes the modulation type on every channel in the spectrum and records the findings as a table, such as 1=NTSC, 2=CW, 3=QAM, 4=NONE can be added to a firmware embodiment to create a more tailored AGC. By adding a detector algorithm to determine type modulation, the DSIM 30 can, by gating for 15750 Hz and inspecting level variation in signals that don't meet 15750, e.g. low variation=CW and high variation=QAM be modulation-type agile as well as frequency agile when searching for pilot signals. Signals below preset level threshold are recorded as NONE, and can, thereby, reduce the Microprocessor 35 resources in finding suitable pilots within the RF signal. One exemplary ALIGN procedure would also include another subroutine to determine low, midrange, and high analogs, along with low, midrange, and high QAM carriers in the RF spectrum.

In operate mode, these frequencies would then be measured in addition to the set pilot frequency. The gain control routine responsively would assign a lighter weight to the other monitored carriers relative to the pilot in determining level control.

While the preferred embodiment of the invention has been illustrated and described, as noted above, many changes can be made without departing from the spirit and scope of the invention. For example, temporal events such as the presence or absence of distinct signals as candidate pilots may be programmed into the Microprocessor 35. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A compact automatic gain control module for an RF amplifier comprising:
   a microchip tuner for detection of pilot signals in an incoming RF signal, the tuner being responsive to command signals from a microprocessor, the microchip tuner having as a lower limit, a tuner noise floor RF input level and as an upper limit, a tuner chip internal automatic gain control RF input threshold level, the lower limit and the upper limit defining a useful input level measurement range, the microchip tuner configured to generate an IF output in response to the RF signals at an input and within the useful input level measurement range;
   the microprocessor including
      machine readable nonvolatile memory including tuner instructions directing the microchip tuner
         to detect a selected IF channel at an IF signal strength within the useful input level measurement range;
         to measure a signal strength of a detected IF signal output by the microchip tuner at a selected RF channel; and
         to generate a gain request signal based upon the measured IF signal strength;
   an equalizer driver that in response to the gain request signal generates equalizer control instructions to an equalizer which attenuates or amplifies the RF signal; and
   the equalizer responsive to the equalizer control instructions.

2. The gain control module of claim 1 further comprising:
   a temperature sensor generating a temperature signal to the microprocessor indicative of a microchip tuner temperature; and
   wherein the microprocessor further includes instructions to the microchip tuner to generate modify the gain request signal in response to the temperature signal.

3. The module of claim 1, wherein the microprocessor includes instructions
   to monitor a voltage level; and
   to adjust the gain request signal based on the monitored voltage level.

4. The module of claim 1, wherein the microprocessor includes instructions to cause the microchip tuner to detect pilot signals of another RF signal when the measured signal strength of the detected IF signal output is below an IF signal level threshold.

5. A method for automatically controlling gain within an RF amplifier, the method comprising:
   receiving an RF signal at a microchip tuner, the RF signal having a signal strength within a useful input measurement range, the microchip tuner being responsive to command signals from a microprocessor, the useful input measurement range being defined at a lower limit by a tuner noise floor RF input level and at an upper limit by a tuner chip internal automatic gain control RF input threshold level, the microchip tuner being configured to generate an IF output in response to RF signals at the input and within the useful input level measurement range;

isolating the IF output corresponding to an RF channel;

sensing the signal strength of the IF output; and generating gain request signals based upon the sensed signal strength of the IF output.

6. The method of claim 5, further comprising amplifying or attenuating an RF output of the microchip tuner in response to the gain request signal.

7. The method of claim 5, further comprising:

sensing microchip tuner temperature;

generating a temperature signal based upon the microchip tuner temperature; and modifying the gain request signal based upon the temperature signal.

\* \* \* \* \*